(12) United States Patent
Obi et al.

(10) Patent No.: US 7,923,894 B2
(45) Date of Patent: Apr. 12, 2011

(54) ACTUATOR, IMAGE PROJECTION APPARATUS AND PRODUCTION METHOD FOR ACTUATOR

(75) Inventors: Hiroshi Obi, Nara (JP); Hironori Tomita, Nara (JP); Akira Kurozuka, Osaka (JP)

(73) Assignee: Panasonic Corporation, Osaka (JP)

( * ) Notice: Subject to any disclaimer, the term of this patent is extended or adjusted under 35 U.S.C. 154(b) by 85 days.

(21) Appl. No.: 12/447,503

(22) PCT Filed: Dec. 3, 2007

(86) PCT No.: PCT/JP2007/073329
§ 371 (c)(1),
(2), (4) Date: Apr. 28, 2009

(87) PCT Pub. No.: WO2008/069176
PCT Pub. Date: Jun. 12, 2008

(65) Prior Publication Data
US 2010/0067078 A1  Mar. 18, 2010

(30) Foreign Application Priority Data

Dec. 5, 2006  (JP) ................................ 2006-327741

(51) Int. Cl.
*G02B 26/08* (2006.01)
*H02N 1/00* (2006.01)
(52) U.S. Cl. .................................... 310/309; 359/224.1
(58) Field of Classification Search .................. 310/309; 359/224.1, 200.6; 257/415
See application file for complete search history.

(56) References Cited

U.S. PATENT DOCUMENTS

| | | | | |
|---|---|---|---|---|
| 5,959,760 A | * | 9/1999 | Yamada et al. | 359/224.1 |
| 6,075,639 A | * | 6/2000 | Kino et al. | 359/224.1 |
| 6,687,034 B2 | * | 2/2004 | Wine et al. | 359/212.2 |
| 6,734,512 B2 | * | 5/2004 | Suzuki | 257/414 |

(Continued)

FOREIGN PATENT DOCUMENTS

JP  2004-013099  1/2004

(Continued)

OTHER PUBLICATIONS

Sunghoon Kwon et al., "Vertical Combdrive Based 2-D Gimbaled Micromirrrors with Large Static Rotation by Backside Island Isolation", IEEE Journal of Selected Topics in Quantum Electronics, vol. 10, No. 3, May/Jun. 2004.*

(Continued)

*Primary Examiner* — Karl I Tamai
(74) *Attorney, Agent, or Firm* — Renner, Otto, Boisselle & Sklar, LLP

(57) ABSTRACT

The present invention is directed to a bi-axial pivoting type actuator having a first movable section, a second movable section supporting the first movable section, and backlining. A first conductive portion and a second conductive portion for independently applying a driving voltage to each of the first movable section and the second movable section are provided on the second movable section, in a state of being split by isolation trenches and being stabilized by the backlining provided under the second movable section. By providing such backlining, mutual stabilization of the first conductive portion and the second conductive portion in an electrically isolated state, and simplification of the production steps for the actuator are realized. By providing a mirror on the first conductive portion of the actuator of the present invention as such, it becomes possible to provide a bi-axial pivoting type mirror device through a simple production process.

10 Claims, 16 Drawing Sheets

U.S. PATENT DOCUMENTS

| | | | |
|---|---|---|---|
| 6,819,822 B2* | 11/2004 | Behin et al. | 385/18 |
| 6,879,428 B2* | 4/2005 | Massieu | 359/290 |
| 7,078,778 B2* | 7/2006 | Schenk | 257/417 |
| 2003/0227700 A1 | 12/2003 | Mizuno et al. | |
| 2009/0180168 A1* | 7/2009 | Kurozuka et al. | 359/221.2 |
| 2010/0067078 A1* | 3/2010 | Obi et al. | 359/200.6 |

FOREIGN PATENT DOCUMENTS

| | | |
|---|---|---|
| JP | 2004-239987 | 8/2004 |
| JP | 2006-115683 | 4/2006 |
| JP | 2006-133387 | 5/2006 |
| JP | 2007-171780 | 7/2007 |

OTHER PUBLICATIONS

International Search Report for corresponding application No. PCT/JP2007/073329 mailed Jan. 8, 2008.

Harald Schenk et al., "An Electrostatically Excited 2D-Micro-Scanning-Mirror with an In-Plane Configuration of the Driving Electrodes"; MEMS 2000, Proceedings Piscataway, NJ: IEEE 2000, pp. 473-478 (cited in [0004], p. 2 of the description).

Jongbaeg Kim et al., "2-D Scanning Mirror using Plastically Deformed Angular Vertical Comb Drive Actuator", Transducers'05, The 13$^{th}$ International Conference on Solid-States Sensors, Actuators and Microsystems, Seoul, Korea, Jun. 5-9, 2005, pp. 697-700.

* cited by examiner

E-E CROSS SECTION

F-F CROSS SECTION

ACTUATOR, IMAGE PROJECTION APPARATUS AND PRODUCTION METHOD FOR ACTUATOR

TECHNICAL FIELD

The present invention relates to an actuator as a micromechanism to which micromachining technology is applied, and may be used for e.g. optical scanning apparatuses for use in laser printers and the like, reading apparatuses such as bar-code readers, laser projectors, and so on.

BACKGROUND ART

In an oscillating mirror device which is formed by micromachining technology, a mirror section is supported by two hinges which are provided along the same line, for example. An electrode is provided at a position opposing the mirror section. Due to an electrostatic attraction occurring between the mirror section and the electrode, the mirror section undergoes reciprocating oscillation, with the two hinges acting as twist pivot axes.

As compared to a mirror device in which a polygon mirror is rotated by a motor, such an oscillating mirror device has a simple structure and permits batch processing in a semiconductor process, and thus is easy to be downsized and has a low production cost. Moreover, an oscillating mirror device has a single reflection surface, and therefore suffers no fluctuations in accuracy like those of a polygon mirror having a plurality of faces. Moreover, the operation of an oscillating mirror device is a reciprocating oscillation, which can be made rapid.

Patent Document 1 discloses a mono-axial pivoting type mirror device, whereas Non-patent Document 1 and Patent Documents 2 and 3 disclose a bi-axial pivoting type mirror device.

A movable section of a mono-axial pivoting type mirror device is a mirror section that is supported by hinges. The mirror section is isolated from a stationary section by isolation trenches, and the mirror section is driven by an electrostatic attraction which occurs when a driving voltage is applied to the mirror section.

In a bi-axial pivoting type mirror device, an intermediate frame supports a mirror section via hinges, and a stationary section supports the intermediate frame via further hinges, such that the mirror section and the intermediate frame portion constitute a movable section.

With reference to FIG. 13, a bi-axial pivoting type mirror device will be described. FIG. 13 is a perspective view showing a bi-axial pivoting type resonant mirror device 51.

The resonant mirror device 51 includes a first movable section 55 having a mirror face, a second movable section 56 supporting the first movable section 55, and a stationary section 63 supporting the second movable section 56.

The resonant mirror device 51 further includes X hinges 61 and Y hinges 57. The second movable section 56 links to and supports the first movable section 55 via the Y hinges 57. The first movable section 55 is capable of pivoting relative to the second movable section 56 around the Y hinges 57, where the pivot axis is an axis which passes through the Y hinges 57 extending along the Y direction in FIG. 13. The stationary section 63 links to and supports the second movable section 56 via the X hinges 61. The second movable section 56 is capable of pivoting relative to the stationary section 63 around the X hinges 61, where the pivot axis is an axis which passes through the X hinges 61 extending along the X direction in FIG. 13.

At its outer periphery, the first movable section includes X electrode combteeth 55a which generate a driving force for causing a relative displacement of the first movable section 55 with respect to the second movable section 56. At its outer periphery, the second movable section 56 includes Y electrode combteeth 64a which generate a driving force for causing a relative displacement of the second movable section 56 with respect to the stationary section 63.

Moreover, at the inner periphery of the second movable section 56, X electrode combteeth 55b are formed which oppose the X electrode combteeth 55a so as to mesh therewith via a gap. At the inner periphery of the stationary section 63, Y electrode combteeth 64b are formed which oppose the Y electrode combteeth 64a so as to mesh therewith via a gap.

As described above, the first movable section 55 is supported so as to be capable of pivoting relative to the second movable section 56 around the Y hinges 57, and the second movable section 56 is supported so as to be capable of pivoting relative to the stationary section 63 around the X hinges 61, thus realizing the bi-axial pivoting type resonant mirror device 51.

The second movable section 56 includes a first conductive portion 56a for applying a voltage to the first movable section 55, and a second conductive portion 56b to which a different voltage is applied. Because of isolation trenches 66 which are formed between the first conductive portion 56a and the second conductive portion 56b, the first conductive portion 56a and the second conductive portion 56b are split, and are electrically insulated from each other. This makes it possible to independently apply a driving voltage to each of the first movable section 55 and the second movable section 56.

FIG. 14 is a diagram showing a cross section of the resonant mirror device 51. This cross-sectional view corresponds to a G-G cross section in FIG. 13. Referring to FIG. 14, polysilicon is embedded after depositing an insulating layer in the isolation trenches 66, whereby the first conductive portion 56a and the second conductive portion 56b are bonded together in such a manner that the first conductive portion 56a and the second conductive portion 56b will not come apart. As a result, the first conductive portion 56a and the second conductive portion 56b will integrally make a displacement as the second movable section 56.

FIG. 15 is a plan view showing an electrical isolation scheme in the resonant mirror device 51. A voltage Vx applied to an X pad 70 serves as a voltage of the first movable section 55. Assuming that the ground pad 72 is at the ground level (GND), a potential difference of Vx occurs between the first movable section 55 and the second movable section 56.

On the other hand, a voltage Vy which is applied to a Y pad 71 serves as a voltage of the stationary section 63, such that a potential difference of Vy occurs between the stationary section 63 and the second movable section 56.

When voltages Vx and Vy are appropriately controlled, the first movable section 55 and the second movable section 56 will undergo resonation operations at their respective resonant frequencies. As a result, in the bi-axial pivoting type resonant mirror device 51, the pivoting around the X axis and the pivoting around the Y axis of the first movable section 55 can be independently controlled.

[Patent Document 1] Japanese Laid-Open Patent Publication No. 2004-239987

[Patent Document 2] Japanese Laid-Open Patent Publication No. 2004-13099

[Patent Document 3] Japanese Laid-Open Patent Publication No. 2006-115683

[Non-patent Document 1] "AN ELECTROSTATICALLY EXCITED 2D-MICRO-SCANNING-MIRROR WITH AN IN-PLANE CONFIGURATION OF THE DRIVING ELECTRODES" (MEMS2000.Proceedings Piscataway, N.J.: IEEE, 2000)

DISCLOSURE OF INVENTION

Problems to be Solved by the Invention

However, the above-described mirror devices have the following problems.

In a mono-axial pivoting type mirror device, bi-axial pivoting is impossible, and its operation is limited to mono-axial pivoting.

In the bi-axial pivoting type mirror device 51 shown in FIG. 13 to FIG. 15, the step of embedding something in the isolation trenches 66 is time-consuming and leads to an increase in cost.

Moreover, as the isolation trenches 66 become deeper, it becomes more difficult to achieve sure embedding. If embedding is incomplete, there is a possibility that the embedded portion may be damaged through oscillation, such that the first conductive portion 56a and the second conductive portion 56b may come apart.

Furthermore, if the deposition of an insulating layer in the isolation trenches 66 is insufficient, there is a possibility that the electrical insulation between the first conductive portion 56a and the second conductive portion 56b may be imperfect.

The present invention has been made in view of the aforementioned problems, and provides an actuator which can be easily formed through a simple production process and which has a high reliability.

Means for Solving the Problems

An actuator according to the present invention is characterized in that it comprises: a movable section; and a stationary section supporting the movable section, wherein, the movable section includes: a first conductive portion to which a first voltage is applied; a second conductive portion to which a second voltage is applied; and backlining for stabilizing the first conductive portion and the second conductive portion to each other in an electrically insulated state, wherein, the second conductive portion and the backlining are electrically connected.

In one embodiment, the movable section includes a first movable section and a second movable section supporting the first movable section; the stationary section supports the second movable section; the second movable section includes the first and second conductive portions; and the first voltage is supplied to the first movable section via the first conductive portion.

In one embodiment, the second movable section further includes electrode combteeth formed in the second conductive portion and in the backlining.

In one embodiment, the backlining has a thickness which is thinner than a thickness of the stationary section.

In one embodiment, the first movable section includes a mirror section for reflecting light; and the backlining stabilizes the first conductive portion and the second conductive portion from a face of the actuator opposite from a face on which the mirror section is provided.

In one embodiment, the first and second movable sections are formed by, in an SOI wafer in which first and second silicon layers are bonded via an insulating layer, etching the first silicon layer; and the backlining is formed by etching the second silicon layer.

In one embodiment, the first conductive portion and the second conductive portion are electrically insulated from each other by a trench which is formed between the first conductive portion and the second conductive portion of the second movable section.

In one embodiment, a dummy trench is formed in a point symmetric position from the trench in the second movable section.

In one embodiment, the first movable section includes first and second electrode combteeth for generating a driving force for causing a relative displacement of the first movable section with respect to the second movable section; the first electrode combteeth extend in a direction which is perpendicular to a pivot axis of the first movable section; the second electrode combteeth extend in a direction which is parallel to the pivot axis of the first movable section; the second movable section includes third and fourth electrode combteeth for generating a driving force for causing a relative displacement of the second movable section with respect to the stationary section; the third electrode combteeth extend in a direction which is perpendicular to a pivot axis of the second movable section; and the fourth electrode combteeth extend in a direction which is parallel to the pivot axis of the second movable section.

an image projection apparatus according to the present invention is characterized in that it comprises: the above actuator; a light source for emitting a light beam; optics for guiding the light beam to the actuator; and a driving section for driving the actuator.

A production method for an actuator according to the present invention is characterized in that it comprises: a step of forming the first and second movable sections by, in an SOI wafer in which first and second silicon layers are bonded via an insulating layer, etching the first silicon layer; a step of forming the backlining by etching the second silicon layer; and a step of electrically connecting a predetermined portion of the second conductive portion that is made of the first silicon layer to the backlining.

The step of forming the backlining includes a step of etching the second silicon layer by using a mask which is used for etching the first silicon layer.

Effects of the Invention

According to the present invention, the backlining stabilizes the first conductive portion and the second conductive portion to each other in an electrically insulated state, and the second conductive portion and the backlining are electrically connected. As a result, the first conductive portion and the second conductive portion can be surely stabilized. Moreover, since it is unnecessary to embed something in any trench between the first conductive portion and the second conductive portion, the production steps of the actuator can be simplified and an inexpensive actuator can be provided. Moreover, since the backlining is not in an electrically floating state, the backlining can be prevented from being electrically charged, whereby a stable driving force can be obtained.

Moreover, in one embodiment, the movable section includes a first movable section and a second movable section supporting the first movable section, whereby a bi-axial pivoting type actuator is obtained.

Moreover, in one embodiment, the backlining includes electrode combteeth. As a result, the area in which electrode combteeth oppose one another while the movable sections are pivoting can be increased, whereby a stable driving force is obtained.

Moreover, in one embodiment, the backlining has a thickness which is thinner than the thickness of the stationary section. As a result, the movable section is reduced in weight, and the movable section is capable of pivoting by a large angle.

Moreover, in one embodiment, a dummy trench is formed at a point symmetric position from a trench in the second movable section, whereby a weight imbalance of the second movable section can be minimized.

Moreover, in one embodiment, the first movable section includes electrode combteeth extending in a direction which is parallel to the pivot axis of the first movable section, and the second movable section includes electrode combteeth extending in a direction which is parallel to the pivot axis of the second movable section. As a result, the first and second movable sections can be driven to greater pivot angles.

Moreover, an image projection apparatus according to the present invention includes the above actuator. Since the actuator of the present invention has a high driving sensitivity, an image projection apparatus having a low power consumption can be realized.

Moreover, in a production method for an actuator according to the present invention, backlining is formed by etching a second silicon layer by using a mask which is used for etching a first silicon layer. As a result, misalignment of electrode combteeth between the first silicon layer and the second silicon layer is prevented, thus realizing a vertical electrode combteeth structure having equal gaps between adjoining electrode combteeth.

According to the present invention, a bi-axial pivoting type actuator can be easily formed through simple processes, whereby an inexpensive resonant mirror device can be provided.

Figure 1:
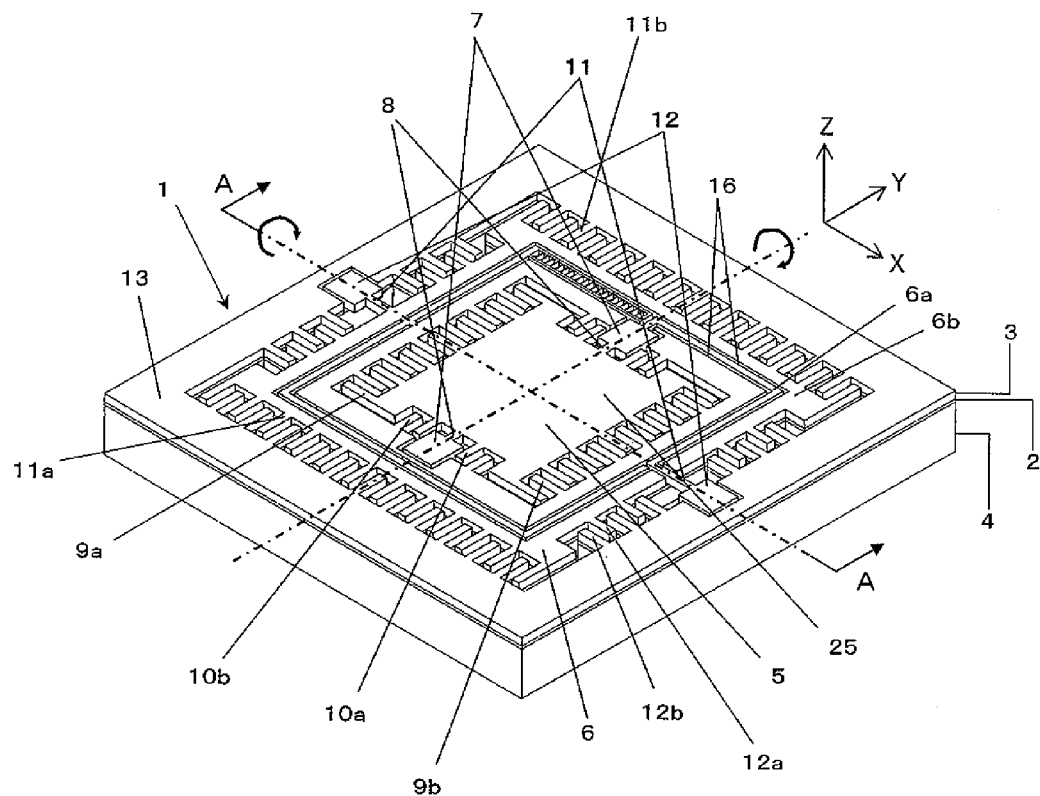
[FIG. 1] A perspective view showing a resonant mirror device according to an embodiment of the present invention.

DESCRIPTION OF REFERENCE NUMERALS 1 resonant mirror device
2 insulating layer
3 device layer
4 handle layer
5 first movable section
6 second movable section
6a first conductive portion
6b second conductive portion
7 Y hinge anchor
8 Y hinge
9a, 9b X electrode combtooth
10a, 10b X auxiliary electrode combtooth
11 X hinge
11a, 11b Y electrode combtooth
12 X hinge anchor
12a, 12b Y auxiliary electrode combtooth
13 stationary section
16 isolation trench
17 backlining
18 X pad
20 dummy trench
21 ground pad
22 Y pad
23 connecting portion
30 SOI wafer
31, 36 oxide layer
32, 37 resist pattern
33, 38 Al layer
34, 39 resist pattern
35 protection layer
40 reflection film
151 light source
152 collimating lens
153 dichroic prism
154 aperture
155 image signal
156 control section
157 laser modulation circuit
158 driving section
159 light beam
160 projection region
100 image projection apparatus

BEST MODE FOR CARRYING OUT THE INVENTION

Hereinafter, with reference to the drawings, embodiments of the present invention will be described.

Embodiment 1

First, with reference to FIG. 1, an actuator according to a first embodiment of the present invention will be described.

FIG. 1 is a perspective view showing a resonant mirror device 1, which is an actuator of the present embodiment.

The resonant mirror device 1 is produced by processing a wafer in which two silicon layers are bonded via an insulating layer 2 of silicon oxide ($SiO_2$), i.e., a so-called SOI (Silicon On Insulator) wafer, for example.

Among the two silicon layers, a first silicon layer is doped with an n type impurity such as phosphorus (P) or arsenic (As) or a p type impurity such as boron (B) so that an electrical conductivity is conferred thereto, and thus is referred to as a device layer 3. A second silicon layer is a thick portion that constitutes a main portion of the wafer, and is referred to as a handle layer 4.

By subjecting the device layer 3 to an etching-based patterning described below, a first movable section 5 and a second movable section 6 are formed. The first movable section 5 and the second movable section 6 may collectively be referred to as a movable section.

The resonant mirror device 1 includes: the first movable section 5 having a mirror face 25; the second movable section 6 supporting the first movable section 5; and stationary section 13 supporting the second movable section 6.

The resonant mirror device 1 further includes X hinges 11 and Y hinges 8. The second movable section 6 links to and supports the first movable section 5 via the Y hinges 8. The first movable section 5 is capable of pivoting relative to the second movable section 6 around the Y hinges 8, where the pivot axis is an axis which passes through the Y hinges 8 extending along the Y direction in FIG. 1. The stationary section 13 links to and supports the second movable section 6 via the X hinges 11. The second movable section 6 is capable of pivoting relative to the stationary section 13 around the X hinges 11, where the pivot axis is an axis which passes through the X hinges 11 extending along the X direction in FIG. 1. The resonant mirror device 1 has a gimbal structure as such. The second movable section 6 is an intermediate frame that is positioned between the stationary section 13, which is an outer frame portion, and the first movable section 5, which is a central portion.

At its outer periphery, the first movable section 5 includes X electrode combteeth 9a and X auxiliary electrode combteeth 10a which generate a driving force for causing a relative displacement of the first movable section 5 with respect to the second movable section 6. The X electrode combteeth 9a extend along a direction which is perpendicular to the pivot axis of the first movable section 5. The X auxiliary electrode combteeth 10a extend along a direction which is parallel to the pivot axis of the first movable section 5. The X auxiliary electrode combteeth 10a are formed along edges of the first movable section 5 to which the Y hinges 8 are connected, whereas the X electrode combteeth 9a are formed along edges to which the Y hinges 8 of the first movable section 5 are not connected. Since the X auxiliary electrode combteeth 10a are formed so as to be parallel to the Y hinges 8 and have a similar or shorter length thereto, no increase in chip size occurs due to the X auxiliary electrode combteeth 10a.

At its outer periphery, the second movable section includes Y electrode combteeth 11a and Y auxiliary electrode combteeth 12a which generate a driving force for causing a relative displacement of the second movable section 6 with respect to the stationary section 13. The Y electrode combteeth 11a extend along a direction which is perpendicular to the pivot axis of the second movable section 6. The Y auxiliary electrode combteeth 12a extend along a direction which is parallel to the pivot axis of the second movable section 6. The Y auxiliary electrode combteeth 12a are formed along edges of the second movable section 6 to which the X hinges 11 are connected, whereas the Y electrode combteeth 11a are formed along edges to which the X hinges 11 of the second movable section 6 are not connected. Since the Y auxiliary electrode combteeth 12a are formed so as to be parallel to the X hinges 11 and have a similar or shorter length thereto, no increase in chip size occurs due to the Y auxiliary electrode combteeth 12a.

Moreover, at the inner periphery of the second movable section 6, X electrode combteeth 9b are formed which oppose the X electrode combteeth 9a so as to mesh therewith via a gap, and X auxiliary electrode combteeth 10b are formed which oppose the X auxiliary electrode combteeth 10a so as to mesh therewith via a gap. At the inner periphery of the stationary section 13, Y electrode combteeth 11b are formed which oppose the Y electrode combteeth 11a so as to mesh therewith via a gap, and Y auxiliary electrode combteeth 12b are formed which oppose the Y auxiliary electrode combteeth 12a so as to mesh therewith via a gap. The effects of the auxiliary electrode combteeth will be described later.

As described above, the first movable section 5 is supported so as to be capable of pivoting relative to the second movable section 6 around the Y hinges 8, and the second movable section 6 is supported so as to be capable of pivoting relative to the stationary section 13 around the X hinges 11, thus realizing the bi-axial pivoting type resonant mirror device 1.

Figure 6A:
[FIG. 6A] A cross-sectional view showing a production step of a resonant mirror device according to an embodiment of the present invention.

When a potential difference occurs between the first movable section 5 and the second movable section 6, the first movable section 5 makes a relative displacement with respect to the second movable section 6. FIG. 6Q is a diagram corresponding to an A-A cross section of the resonant mirror device 1 shown in FIG. 1. Referring to FIG. 1 and FIG. 6Q, the second movable section 6 includes a first conductive portion 6a for applying a first voltage to the first movable section 5 and a second conductive portion 6b to which a second voltage is applied. Because of isolation trenches 16 which are formed between the first conductive portion 6a and the second conductive portion 6b, the first conductive portion 6a and the second conductive portion 6b are split, and are electrically insulated from each other. This makes it possible to independently apply a driving voltage to each of the first movable section 5 and the second movable section 6.

Figure 2:
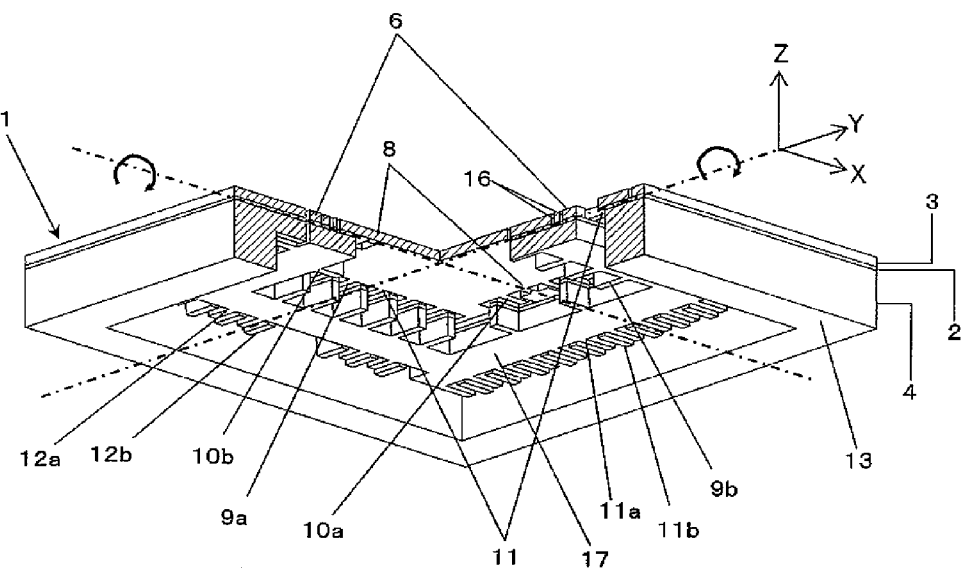
[FIG. 2] A bottom perspective view showing a resonant mirror device according to an embodiment of the present invention.

FIG. 2 is a bottom perspective view showing the resonant mirror device 1. FIG. 2 shows the resonant mirror device 1 with some constituent elements being omitted from illustration. The resonant mirror device 1 further includes backlining 17 for stabilizing the first conductive portion 6a and the second conductive portion 6b (FIG. 1) to each other in an electrically insulated state. The first conductive portion 6a and the second conductive portion 6b are stabilized by the backlining 17 on a face (i.e., a lower face) that is opposite to the face (upper face) on which the mirror face 25 of the resonant mirror device 1 is provided. The thickness of the backlining 17 is thinner than the thickness of the stationary section 13.

With reference to FIG. 2, the handle layer 4 is removed from under the first and second movable sections 5 and 6, so that the first and second movable sections 5 and 6 become capable of pivoting. Under the second movable section 6, the handle layer 4 is partially left as the backlining 17. This remaining handle layer 4 and the insulating layer 2 in the same position constitute the backlining 17. The backlining 17 is formed with a thickness which is thinner than the thickness of the stationary section 13, thus allowing the second movable section 6 to have a light weight.

Figure 3:
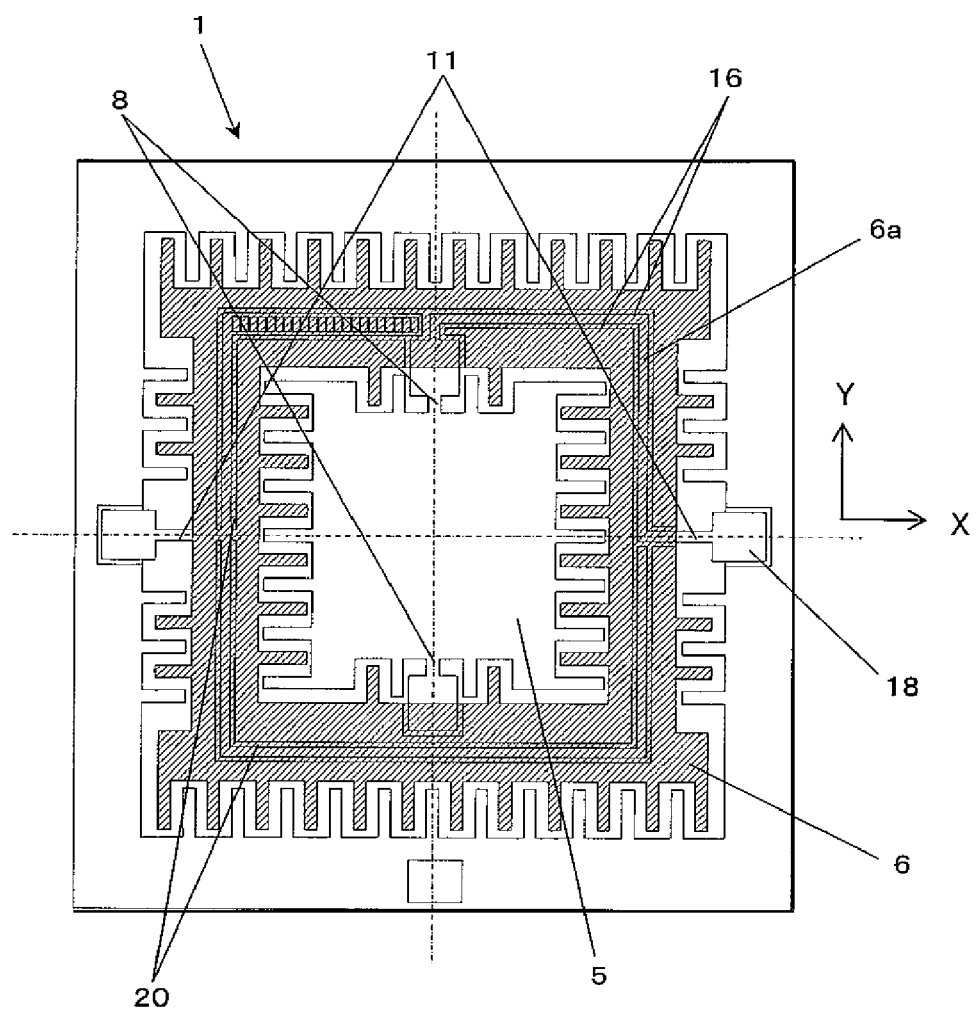
[FIG. 3] A plan view showing a resonant mirror device according to an embodiment of the present invention.

FIG. 3 is a plan view showing positioning of the backlining 17 in the resonant mirror device 1. A hatched portion shown in FIG. 3 is the backlining 17, and the isolation trenches 16 is formed in this region where the backlining 17 is present. Therefore, even when the first conductive portion 6a and the second conductive portion 6b are isolated by the isolation trenches 16, the first conductive portion 6a and the second conductive portion 6b (FIG. 1) will integrally make a displacement. Unlike in the conventional example, it is unnecessary to employ a step of embedding another material in the isolation trenches 16 for binding.

Moreover, the insulating layer 2, the device layer 3, and the handle layer 4 are of a wafer structure which is strongly bonded together in advance. Therefore, there is a sufficiently reliable binding strength between the second movable section 6, which is formed of the device layer 3, and the backlining 17, which is formed of the insulating layer 2 and the handle layer 4.

There is also no need to employ an embedding step for insulation. Thus, there is no fear of the electrical insulation between the first conductive portion 6a and the second conductive portion 6b becoming imperfect.

The isolation trenches 16 forming the first conductive portion 6a, which is a connecting portion connecting an X pad 18 to the first movable section 5, are at an unbalanced position with respect to the pivot axes. Left as it is, this would result in a weight imbalance of the second movable section 6, possibly inducing unwanted resonations upon resonance driving, e.g., up and down movements of the second movable section 6. Therefore, with respect to the center of the second movable section 6, dummy trenches 20 are formed at point symmetric positions from the isolation trenches 16 on the second movable section 6. Moreover, dummy trenches 20 are formed at axisymmetric positions with respect to the X pivot axis, and axisymmetric positions with respect to the Y pivot axis, from the isolation trenches 16 on the second movable section 6. By forming the dummy trenches 20 at symmetric positions from the isolation trenches 16, shift in the weight balance can be minimized.

Figure 4:
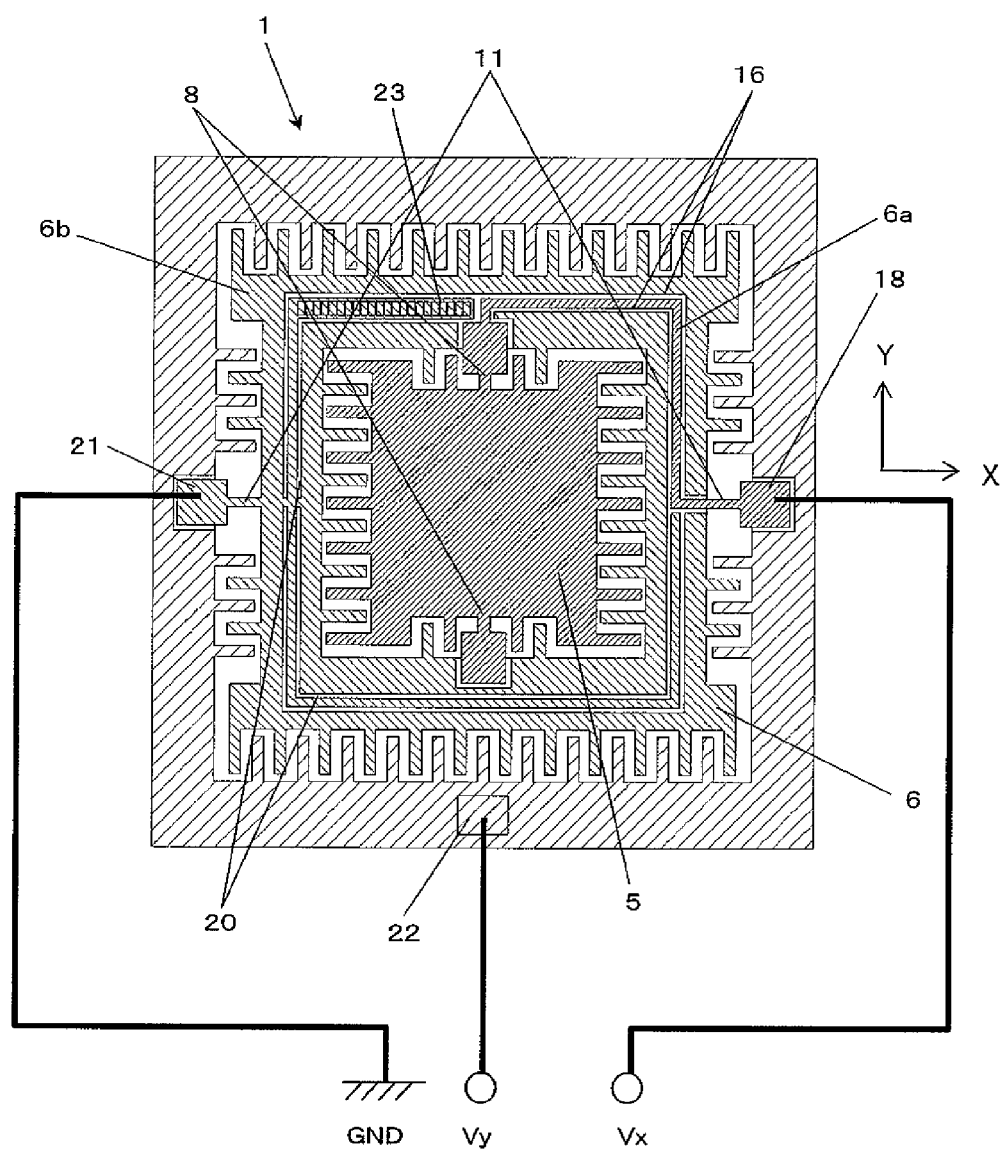
[FIG. 4] A plan view showing an electrical isolation scheme in a resonant mirror device according to an embodiment of the present invention.

FIG. 4 is a plan view showing an electrical isolation scheme in the resonant mirror device 1.

In FIG. 4, as described earlier, the second movable section 6 has isolation trenches 16 formed therein, thus being electrically split into two regions. One region is a region which begins at the X pad 18, goes through an X hinge 11, the first conductive portion 6a, and a Y hinge 8, and leads into the first movable section 5. The other region is a region which begins at a ground pad 21, goes through an X hinge 11, and leads into the second movable section 6. In the second movable section 6, via a connecting portion 23 which is provided in a dummy trench 20, the second conductive portion 6b and the backlining 17 are electrically connected.

In such a construction, a voltage Vx applied to the X pad 18 serves as a voltage of the first movable section 5, and assuming that the ground pad 21 is at the ground level (GND), a potential difference of Vx occurs between the first movable section 5 and the second movable section 6.

On the other hand, a voltage Vy applied to the Y pad 22 serves as a voltage of the stationary section 13, such that a potential difference of Vy occurs between the stationary section 13 and the second movable section 6.

When voltages Vx and Vy are appropriately controlled, the first movable section 5 and the second movable section 6 will undergo resonation operations at their respective resonant frequencies. As a result, in the bi-axial pivoting type resonant mirror device 1, the pivoting around the X axis and pivoting around the Y axis of the first movable section 5 can be independently controlled.

Figure 5:
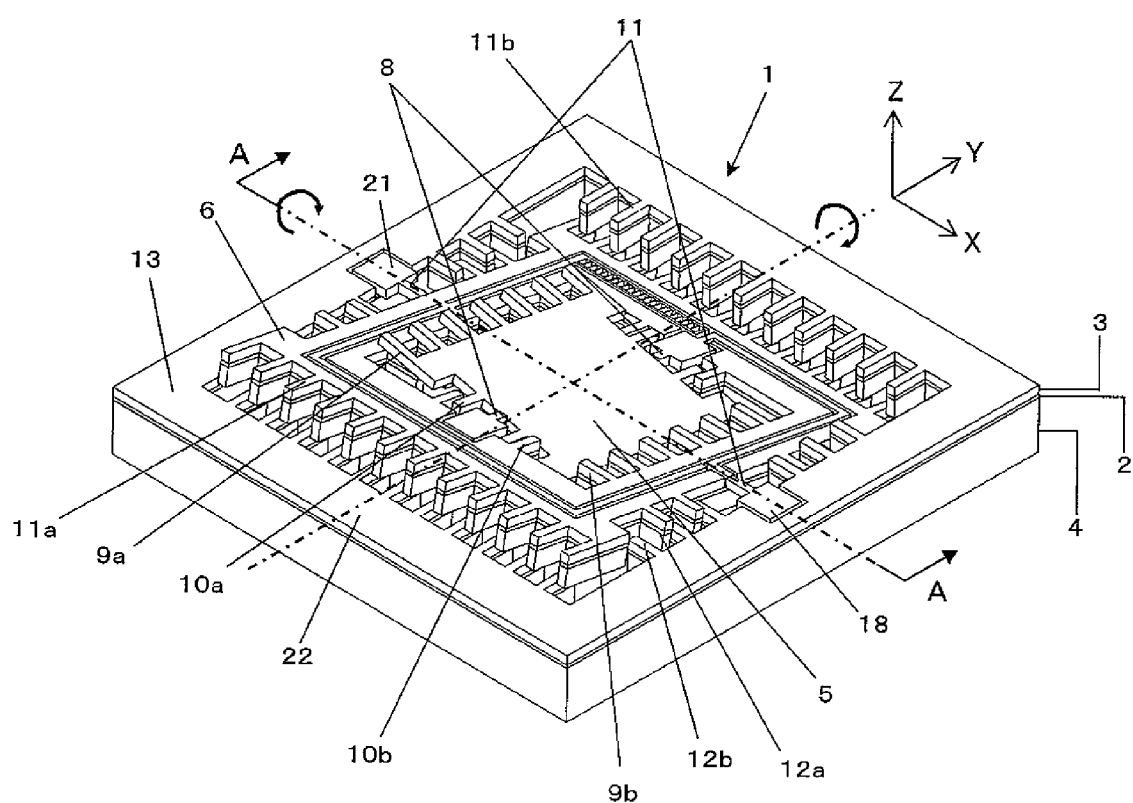
[FIG. 5] A perspective view showing an operation of a resonant mirror device according to an embodiment of the present invention.

FIG. 5 is a perspective view showing an operating state of the resonant mirror device 1.

The first movable section 5 pivots relative to the second movable section 6 around the Y hinges 8. Together with the first movable section 5, the second movable section 6 pivots relative to the stationary section 13 around the X hinges 11. As a result, a laser beam which is reflected from the first movable section 5 attains a two-dimensional scanning along the X-Y directions.

Next, a production method for the resonant mirror device 1 will be described. FIG. 6A to FIG. 6Q are diagrams showing production steps for the resonant mirror device 1. These cross-sectional views correspond to the A-A cross section in FIG. 1.

With reference to FIG. 6A, an SOI wafer 30 is provided. The thickness of the device layer 3, which defines the thickness of the first movable section 5 and second movable section 6, is determined by taking into consideration the resonant frequencies, oscillation amplitudes responsive to a driving voltage, rigidities, etc. of the movable sections. Herein, it is assumed that there is a device layer 3 of 50 μm, an insulating layer 2 of 2 μm, and a handle layer 4 of 300 μm.

First, the device layer 3 and the handle layer 4 are doped with an n type impurity such as P or As or a p type impurity such as B, so that an electrical conductivity is conferred thereto. However, in the case of employing an SOI wafer whose device layer 3 and handle layer 4 are already electrically conductive, the impurity doping process for conferring electrical conductivity is not needed.

Figure 6B:
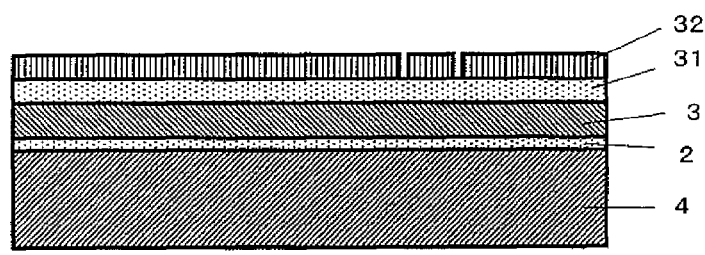
[FIG. 6B] A cross-sectional view showing a production step of a resonant mirror device according to an embodiment of the present invention.

Next, with reference to FIG. 6B, an oxide layer 31 is formed on the surface of the device layer 3 by CVD (Chemical Vapor Deposition), and a photoresist in liquid form is formed into a film by spin coating, and, through exposure and development, a resist pattern 32 is formed. As the photoresist, AZP4210 or AZ1500 (manufactured by Clariant (Japan) K.K.) may be used, for example. Any later resist pattern is also formed through such photoresist film formation followed by exposure and development.

Figure 6C:
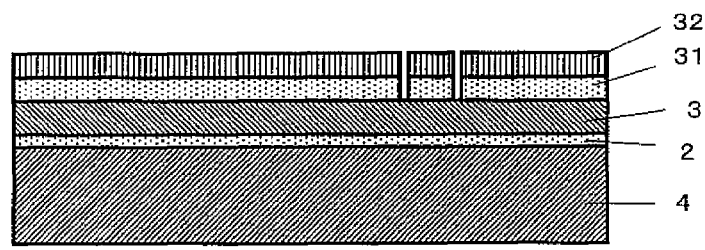
[FIG. 6C] A cross-sectional view showing a production step of a resonant mirror device according to an embodiment of the present invention.

Next, with reference to FIG. 6C, the oxide layer 31 is etched with BHF (buffered hydrofluoric acid), by using the resist pattern 32 as a mask.

Figure 6D:
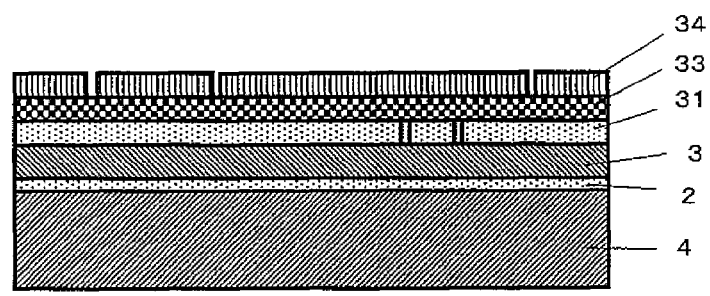
[FIG. 6D] A cross-sectional view showing a production step of a resonant mirror device according to an embodiment of the present invention.

Next, with reference to FIG. 6D, on the surface of the oxide layer 31 from which the resist pattern 32 has been removed, Al (aluminum) is deposited via vacuum evaporation to form an Al layer 33, and a photoresist in liquid form is formed into a film by spin coating, and, through exposure and development, a resist pattern 34 is formed.

Figure 6E:
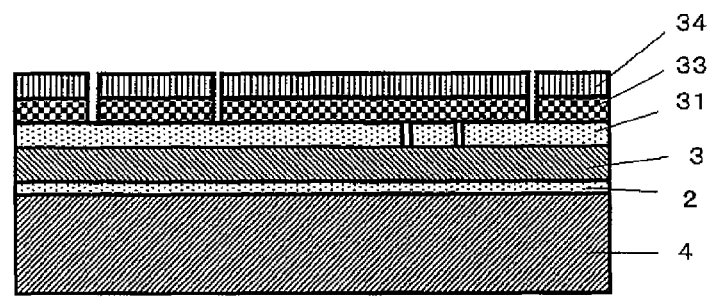
[FIG. 6E] A cross-sectional view showing a production step of a resonant mirror device according to an embodiment of the present invention.

Next, with reference to FIG. 6E, by using the resist pattern 34 as a mask, the Al layer 33 is etched by using an aluminum etching solution such as a mixed acid aluminum solution.

Figure 6F:
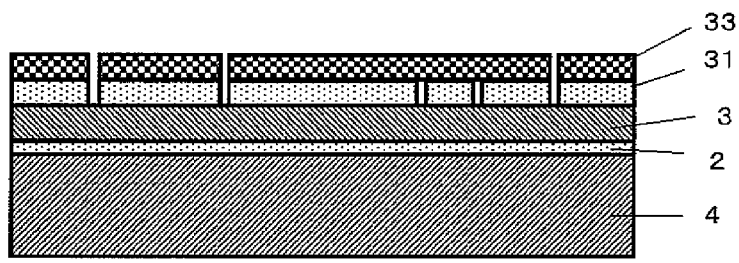
[FIG. 6F] A cross-sectional view showing a production step of a resonant mirror device according to an embodiment of the present invention.

Next, with reference to FIG. 6F, the resist pattern 34 is removed, and by using an Al layer 33 as a mask, the oxide layer 31 is through-etched to the device layer 3 via Deep-RIE (Deep Reactive Ion Etching).

Figure 6G:
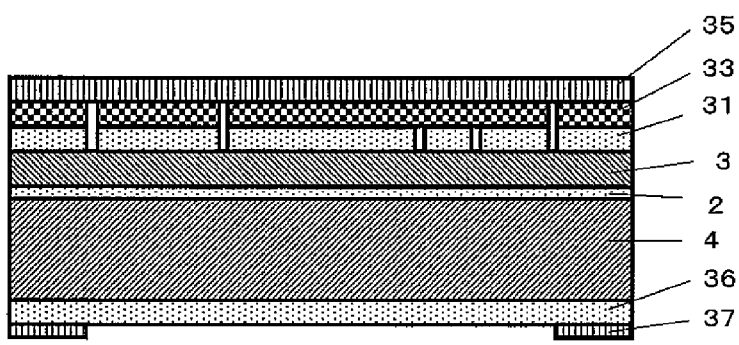
[FIG. 6G] A cross-sectional view showing a production step of a resonant mirror device according to an embodiment of the present invention.

Next, with reference to FIG. 6G, a protection layer is formed on the surface of the Al layer 33 via spin coating by using a photoresist in liquid form. On the surface of the handle layer 4, an oxide is deposited via CVD to form an oxide layer 36, and a photoresist in liquid form is formed into a film by spin coating, and, through exposure and development, a resist pattern 37 is formed.

Figure 6H:
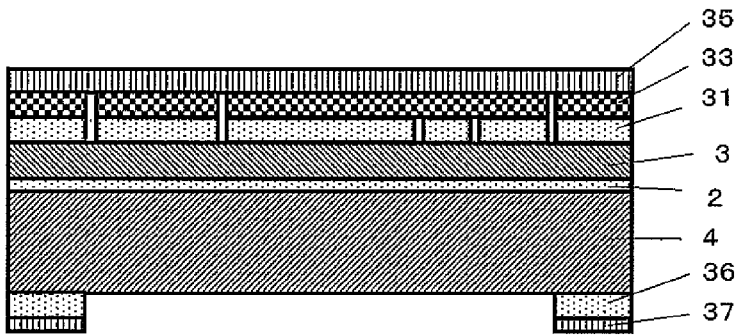
[FIG. 6H] A cross-sectional view showing a production step of a resonant mirror device according to an embodiment of the present invention.

Next, with reference to FIG. 6H, the oxide layer 36 is etched with BHF by using the resist pattern 37 as a mask.

Figure 6I:
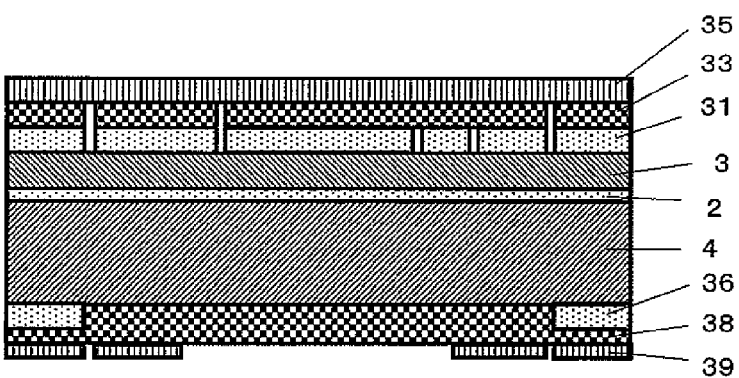
[FIG. 6I] A cross-sectional view showing a production step of a resonant mirror device according to an embodiment of the present invention.

Next, with reference to FIG. 6I, the resist pattern is removed, and Al is deposited on the surface of the oxide layer 36 and the handle layer 4 via vacuum evaporation to form an Al layer 38, and a photoresist in liquid form is formed into a film by spin coating, and, through exposure and development, a resist pattern 39 is formed.

Figure 6J:
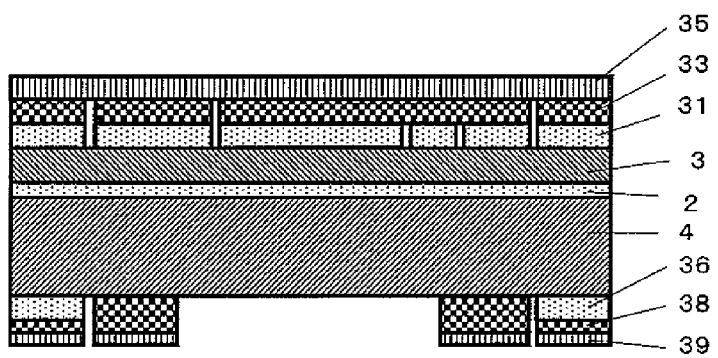
[FIG. 6J] A cross-sectional view showing a production step of a resonant mirror device according to an embodiment of the present invention.

Next, with reference to FIG. 6J, the Al layer 38 is etched by using the resist pattern 39 as a mask, using an aluminum etching solution such as a mixed acid aluminum solution.

Figure 6K:
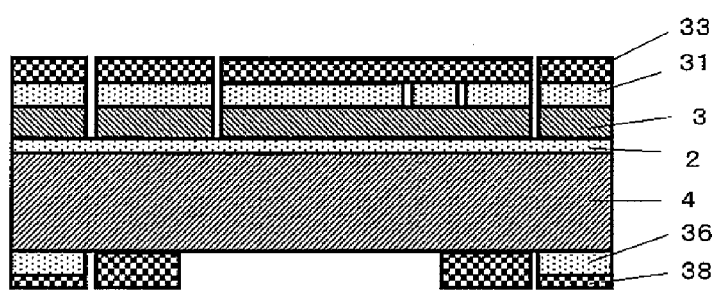
[FIG. 6K] A cross-sectional view showing a production step of a resonant mirror device according to an embodiment of the present invention.

Next, with reference to FIG. 6K, the protection layer 35 and the resist pattern 39 are removed. By using the Al layer 33 as a mask, the silicon in the device layer 3 is through-etched to the insulating layer 2 via Deep-RIE. In the Deep-RIE, as a Bosch process where etching and side wall protection are alternately performed, etching with an $SF_6$ gas and side wall protection with a $C_4F_8$ gas are performed. These conditions can be adopted also in any later Deep-RIE for the silicon layers.

Figure 6L:
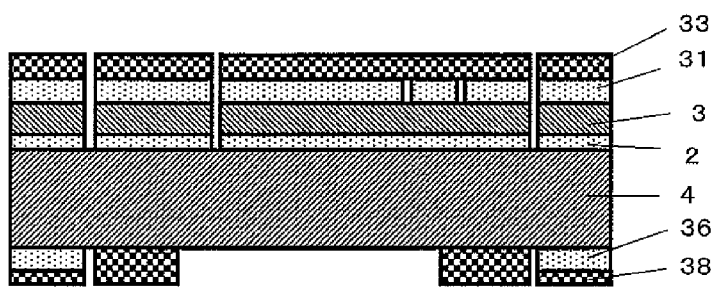
[FIG. 6L] A cross-sectional view showing a production step of a resonant mirror device according to an embodiment of the present invention.

Next, with reference to FIG. 6L, the silicon oxide in the insulating layer 2 is through-etched to the handle layer 4 via Deep-RIE, by using the Al layer 33 as a mask.

Figure 6M:
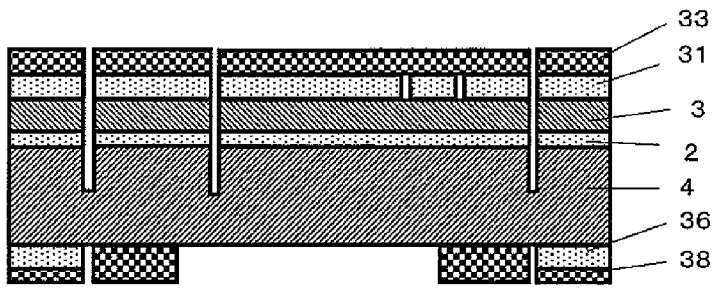
[FIG. 6M] A cross-sectional view showing a production step of a resonant mirror device according to an embodiment of the present invention.

Next, with reference to FIG. 6M, the silicon in the handle layer 4 is etched via Deep-RIE, by using the Al layer 33 as a mask. This etching spans a length corresponding to the thickness of the backlining 17 (e.g., thickness 50 μm), from the insulating layer 2 side of the handle layer 4.

Figure 6N:
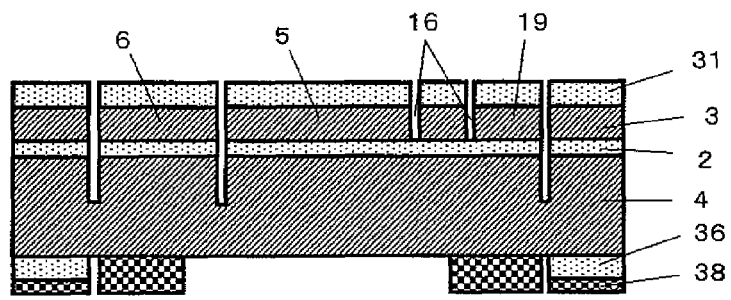
[FIG. 6N] A cross-sectional view showing a production step of a resonant mirror device according to an embodiment of the present invention.

Next, with reference to FIG. 6N, the Al layer 33 is removed with an aluminum etching solution, and by using the oxide layer 31 as a mask, the silicon in the device layer 3 is through-etched to the insulating layer 2 via Deep-RIE. a result, shapes in the movable section are formed, e.g., the mirror section 5, the second movable section 6, the electrode combteeth, the hinges, the isolation trenches 16, and the connecting portion 23 (FIG. 4). At this time, since there is no problem if the handle layer 4 is etched, some of the apertures in the mask of the oxide layer 31 coincide with the apertures of the mask of the Al layer 33.

Figure 6O:
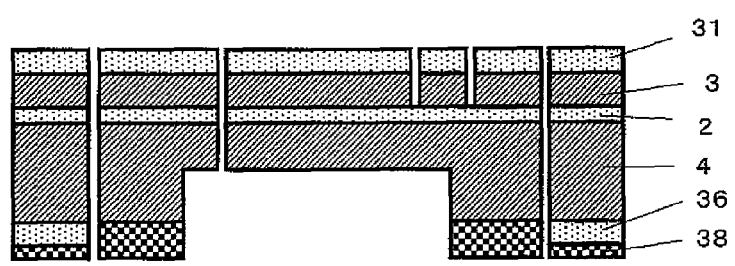
[FIG. 6O] A cross-sectional view showing a production step of a resonant mirror device according to an embodiment of the present invention.

Next, with reference to FIG. 6O, by using the Al layer 38 as a mask, the silicon in the handle layer 4 is etched via Deep-RIE. This etching spans a depth which is approximately the thickness of the backlining 17 (FIG. 2), from the surface of the handle layer 4. Herein, the etching depth is 260 μm. After the etching, the Al layer 38 is removed with an aluminum etching solution.

Figure 6P:
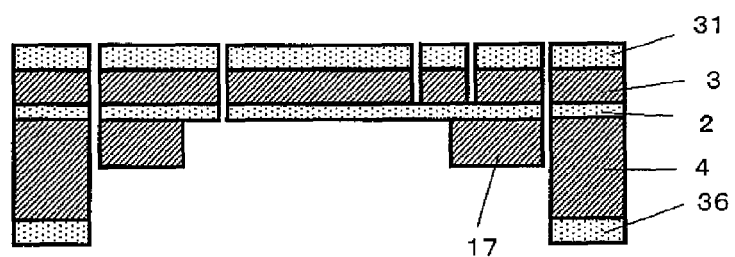
[FIG. 6P] A cross-sectional view showing a production step of a resonant mirror device according to an embodiment of the present invention.
Figure 6Q:
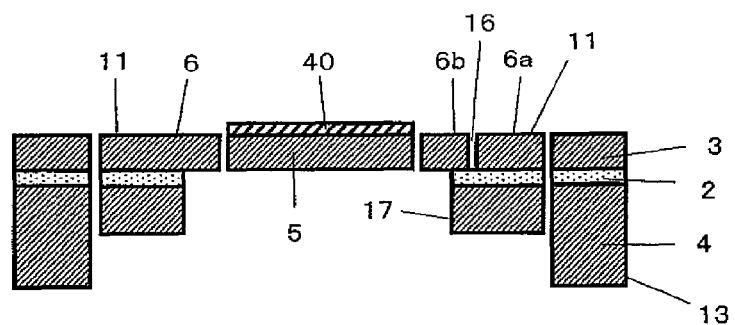
[FIG. 6Q] A cross-sectional view showing a production step of a resonant mirror device according to an embodiment of the present invention.

Next, with reference to FIG. 6P, by using the oxide layer 36 as a mask, the silicon in the handle layer 4 is etched until reaching the insulating layer 2 via Deep-RIE. As a result, the backlining 17 and the outer frame portion 13 (FIG. 1) are formed. Since a slight overetching is to be performed so that the etching will surely reach the insulating layer 2, the etching depth which has been described with reference to FIG. 6O is to be set by taking this overetching into account. The thickness of the backlining 17 is designed so as to take into account the necessary strength, resonant frequencies of the movable sections, necessary amplitudes responsive to a driving voltage, and the like. Herein, it is assumed that the thickness is 50 μm.

Next, with reference to FIG. 6Q, the exposed insulating layer 2 and oxide film patterns 31 and 36 (FIG. 6P) are removed, and the movable section is released. On the surface of the first movable section 5, aluminum, gold, or silver is vacuum-deposited as a reflection film 40. The thickness of the reflection film 40 is e.g. 50 nm, and its material is to be appropriately selected in accordance with the wavelength of the light used and the necessary reflectance.

Herein, in the step of forming the electrode combteeth of the backlining 17 and the handle layer etching is performed by using, as a mask, the aluminum layer 33 which was used for forming the electrode combteeth of the device layer 3 via etching. Therefore, without complicating the processes, it is possible to form the electrode combteeth of the backlining 17 and the handle layer 4 at the same positions as the electrode combteeth of the device layer 3. Since misalignment of electrode combteeth is prevented between the device layer 3 and the handle layer 4, there is realized a vertical electrode combteeth structure having equal gaps between adjoining electrode combteeth.

Next, a method for electrically connecting the backlining 17 and the second conductive portion 6b via the connecting portion 23 (FIG. 4) will be described.

In the process of removing the insulating layer 2 to release the movable section (FIG. 6Q), an etching along a diametric direction of the SOI wafer 30 occurs simultaneously with an etching along the thickness direction of the SOI wafer 30 (FIG. 6A). This etching of the SOI wafer 30 along a diametric direction is referred to as side etching.

Figure 7A:
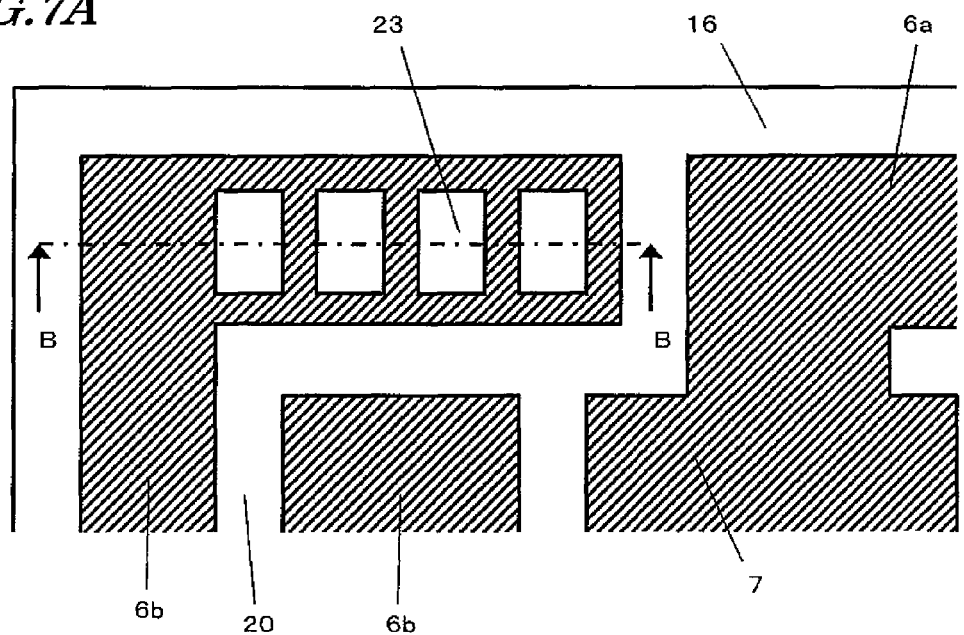
[FIG. 7A] A diagram showing a connecting portion of a resonant mirror device according to an embodiment of the present invention and the neighborhood thereof.

The side etching will be specifically described with reference to FIG. 7A to FIG. 7E. FIG. 7A is an enlarged diagram showing the connecting portion 23 of the resonant mirror device 1 shown in FIG. 4 as well as its neighborhood. FIG. 7B to FIG. 7E are diagrams of the connecting portion 23 shown in FIG. 7A as well as its neighborhood, corresponding to a B-B cross section.

Figure 7B:
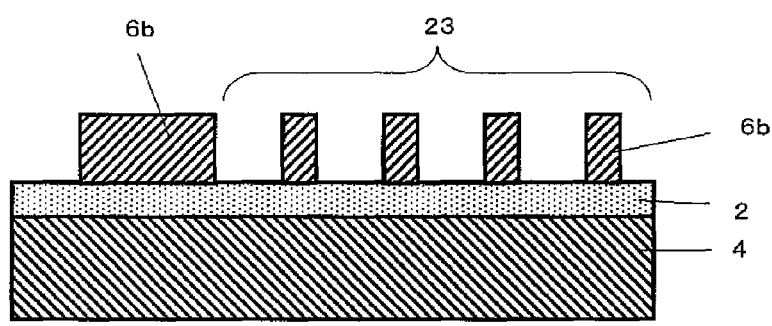
[FIG. 7B] A diagram showing a connecting portion of a resonant mirror device according to an embodiment of the present invention and the neighborhood thereof.
Figure 7C:
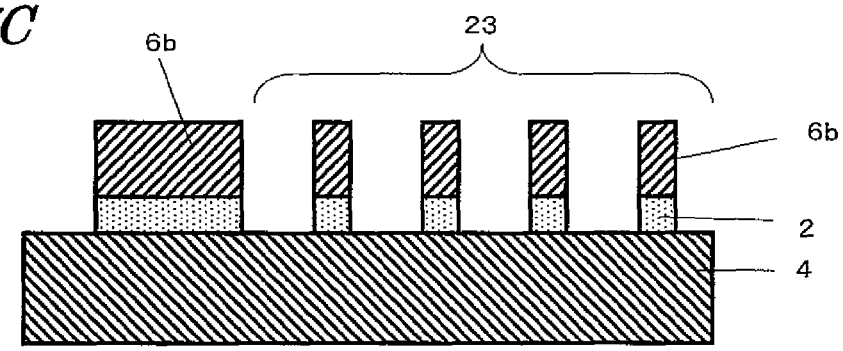
[FIG. 7C] A diagram showing a connecting portion of a resonant mirror device according to an embodiment of the present invention and the neighborhood thereof.
Figure 7D:
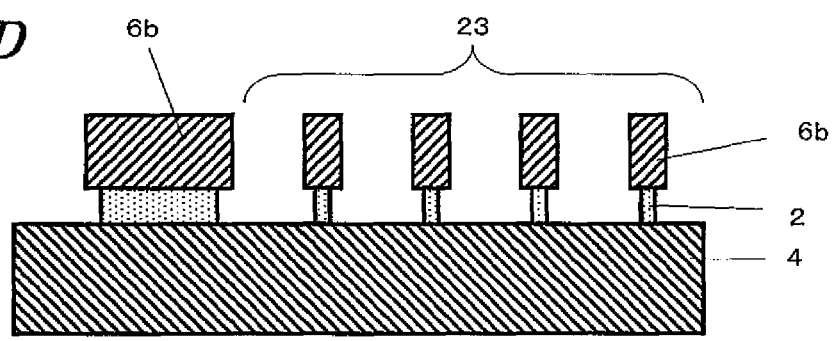
[FIG. 7D] A diagram showing a connecting portion of a resonant mirror device according to an embodiment of the present invention and the neighborhood thereof.
Figure 7E:
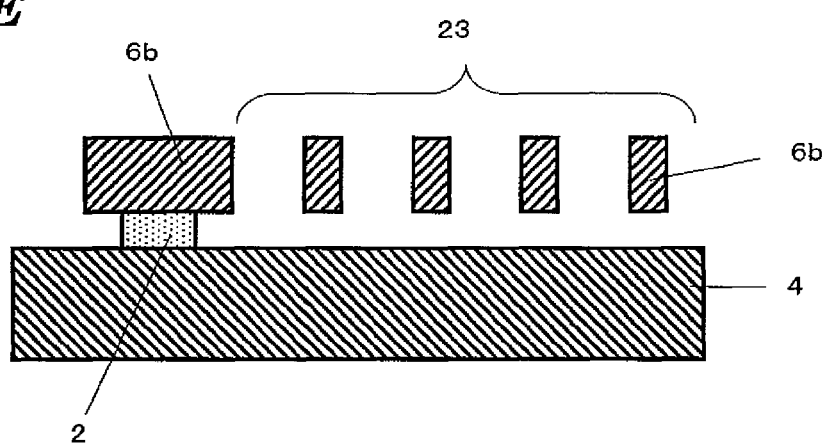
[FIG. 7E] A diagram showing a connecting portion of a resonant mirror device according to an embodiment of the present invention and the neighborhood thereof.

When the insulating layer 2 shown in FIG. 7B is etched, as shown in FIG. 7C, the portions which are apertures are etched first. Then, side etching begins as shown in FIG. 7D, and as the side etching further progresses, as shown in FIG. 7E, the insulating layer 2 which has been securing the second conductive portion 6b and the handle layer 4 at the connecting portion 23 is completely removed. Through such side etching, the insulating layer 2 between the second conductive portion 6b and the backlining 17 at the connecting portion 23 is removed. As a result, electrical connection between the second conductive portion 6b and the backlining at the connecting portion 23 becomes possible. This electrical connection between the second conductive portion 6b and the backlining 17 will be described with reference to FIG. 8A to FIG. 8D.

Figure 8A:
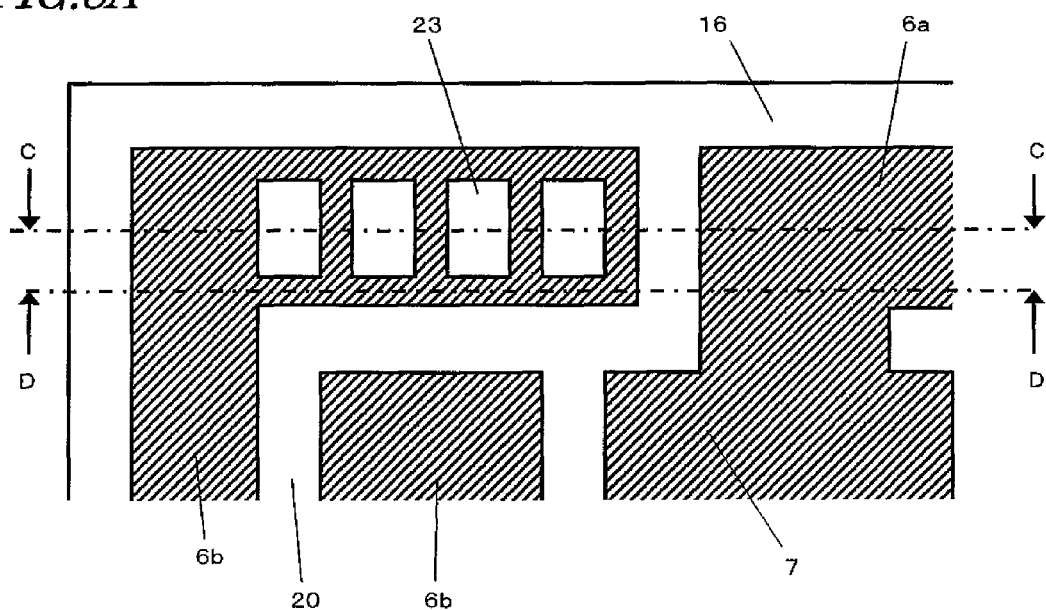
[FIG. 8A] A diagram showing a connecting portion of a resonant mirror device according to an embodiment of the present invention and the neighborhood thereof.
Figure 8B:
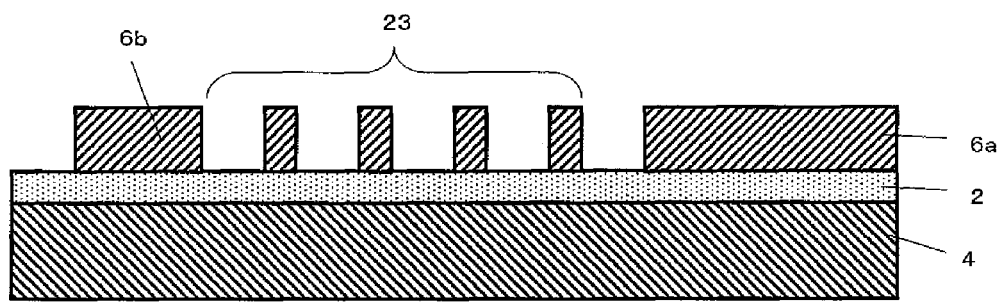
[FIG. 8B] A diagram showing a connecting portion of a resonant mirror device according to an embodiment of the present invention and the neighborhood thereof.
Figure 8C:
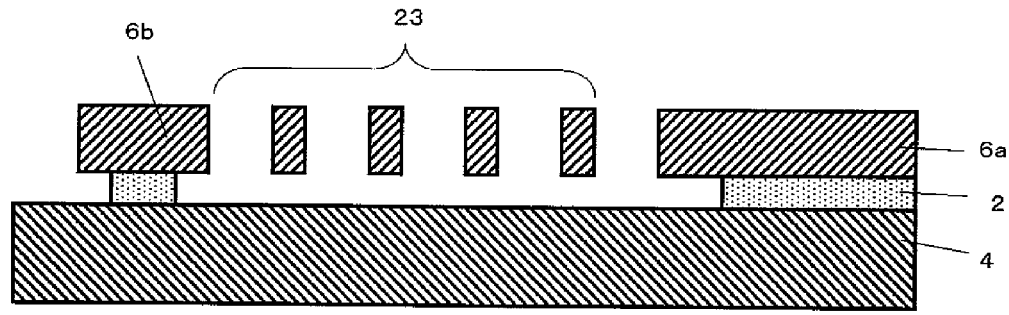
[FIG. 8C] A diagram showing a connecting portion of a resonant mirror device according to an embodiment of the present invention and the neighborhood thereof.
Figure 8D:
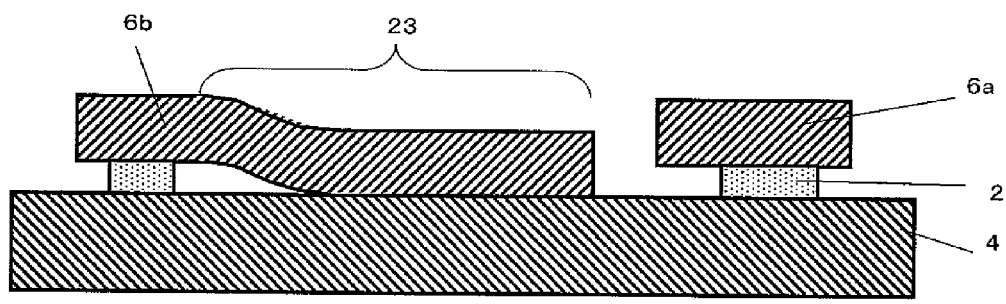
[FIG. 8D] A diagram showing a connecting portion of a resonant mirror device according to an embodiment of the present invention and the neighborhood thereof.

FIG. 8A is an enlarged diagram showing the connecting portion 23 of the resonant mirror device 1 as well as its neighborhood. FIG. 8B and FIG. 8C are diagrams showing the connecting portion 23 shown in FIG. 8A as well as its neighborhood, corresponding to a C-C cross section. FIG. 8D is a diagram corresponding to a D-D cross section.

When the insulating layer 2 shown in FIG. 8B is etched, as shown in FIG. 8C, the insulating layer 2 which has been securing the second conductive portion 6b and the handle layer 4 at the connecting portion 23 is completely removed. The etching conditions are set so that the insulating layer 2 which is securing any region of the second conductive portion 6b other than the connecting portion 23, the Y hinge anchors 7 (FIG. 1), and the first conductive portion 6a, etc., to the handle layer 4 are not completely removed through the side etching.

Methods of electrical connection between the second conductive portion 6b and the backlining 17 at the connecting portion 23 include, for example, a method of electrically connecting the second conductive portion 6b and the backlining 17 via sticking (a phenomenon of becoming stuck). For example, removal of the insulating layer 2 and the oxide film patterns 31 and 36 shown in FIG. 6Q may be performed through a wet etching process using HF (hydrofluoric acid) or BHF (buffered hydrofluoric acid), and when taking the wafer out of the etchant (HF or BHF) or during a wet cleaning for rinsing off the etchant, the second conductive portion 6b and the backlining 17 will become electrically connected via sticking.

Alternatively, for example, in the case where the removal of the insulating layer 2 and the oxide film patterns 31 and 36 shown in FIG. 6Q is performed through a dry etching process so that no sticking occurs (i.e., when there is an interspace), a voltage is applied to the ground pad 21 (FIG. 4) to cause a pull-in phenomenon that is associated with a potential difference between the second conductive portion 6b and the backlining 17 (a phenomenon where the second conductive portion 6b collides with the backlining 17). At this time, sticking will occur if water molecules or the like are present in the plane of contact or the interspace between the second conductive portion 6b and the backlining 17, thus connecting the second conductive portion 6b and the backlining 17.

Note that an aperture structure is adopted for the connecting portion 23 in order to sufficiently decrease the restoration force of the connecting portion 23, as needed for connecting the second conductive portion 6b and the backlining 17 via sticking, and further in order to minimize the etching amount due to side etching.

Alternatively, for example, the second conductive portion 6b and the backlining 17 can be connected by applying a conductor to the interior of the connecting portion 23 by using a microcircuit printing apparatus or the like. A microcircuit printing apparatus is an apparatus which attains fine printing with an ink containing microconductors by utilizing a nanoink printing technique, with a method similar to the inkjet application of ink in a printing technique. In this case, it is preferable to set the etching conditions so that the insulating layer 2 at the connecting portion 23 will not be completely removed through side etching, and that the ink containing microconductors will not spread outside the connecting portion 23.

Alternatively, the second conductive portion 6b and the backlining 17 may be connected by using a dispenser for applying an adhesive or a small amount of liquid, for example, a conductor may be applied to the interior of the connecting portion 23. In that case, too, it is preferable to set the etching conditions so that the insulating layer 2 at the connecting portion 23 will not be completely removed through side etching, and that the conductors will not spread outside the connecting portion 23.

When applying a voltage to drive the resonant mirror device 1, if the backlining 17 were in an electrically floating state, the backlining 17 would be electrically charged so that a desired potential difference might not be stably obtained, thus being unable to generate a stable driving force. However, as described above, by electrically connecting the backlining 17 and the second conductive portion 6b, the backlining 17 is prevented from being electrically charged, whereby a stable potential difference is generated and a stable driving force can be obtained. Moreover, since the backlining 17 and the second conductive portion 6b are at the same potential, by forming electrode combteeth also in the backlining 17, the area in which electrode combteeth oppose one another while the movable sections 5 and 6 are pivoting can be increased, whereby a stable driving force is obtained.

Next, the functions of the auxiliary electrode combteeth will be described. In general, the relationship between a driving force F and a displacement x of an electrostatic actuator is determined by a capacitance C and a voltage V between electrodes. The capacitance C is determined by an opposing area S between electrodes opposing each other via a gap g. Given a dielectric constant $\epsilon_0$, the capacitance C is expressed as:

$$C(x) = \epsilon_0 S/g. \qquad [\text{eq.1}]$$

The driving force F is expressed as follows.

$$F = \frac{\partial}{\partial x}\left(\frac{1}{2}C(x)V^2\right) \quad \text{[eq. 2]}$$

Figure 9:
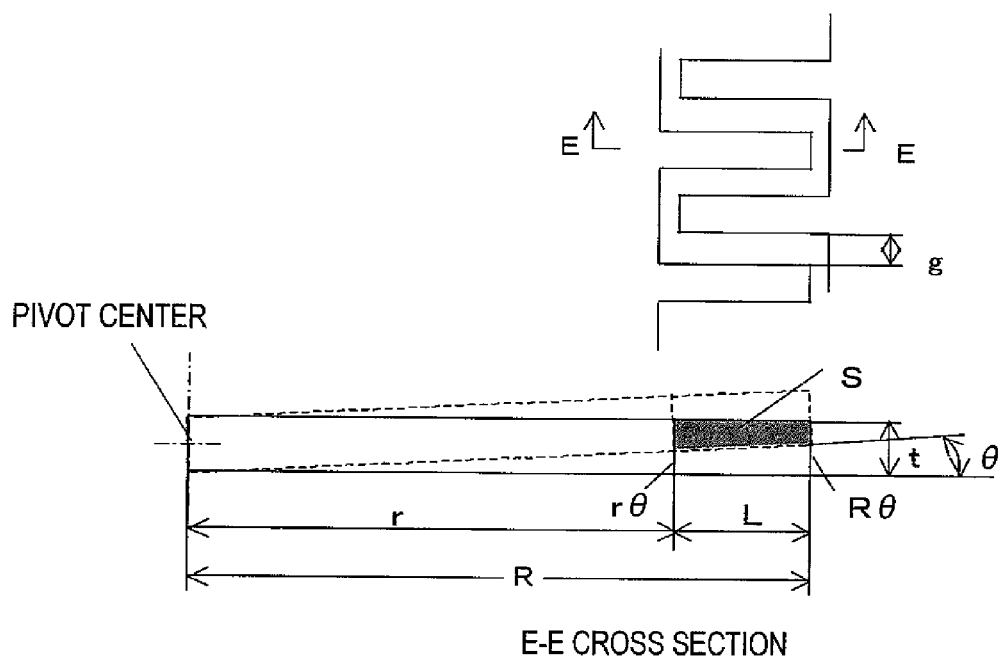
[FIG. 9] A cross-sectional view showing an opposing area between electrode combteeth of a resonant mirror device according to an embodiment of the present invention.

FIG. 9 is a cross-sectional view showing an opposing area between electrode combteeth of the resonant mirror device 1. The cross-sectional view shown in FIG. 9 corresponds to an E-E cross section in an upper plan view shown thereabove.

With reference to FIG. 9, when electrode combteeth having a length L and a thickness t are provided at a distance r from the pivot center, an electrode area S which opposes via a gap g is expressed as:

$$S_{main} = 2N_{main}(t \cdot L - L(r + R)\theta/2) \quad \text{[eq. 3]}$$
$$= 2N_{main} \cdot L(t - (r + R)\theta/2),$$

given a pivot angle θ and a number Nmain of combteeth.

Figure 10:
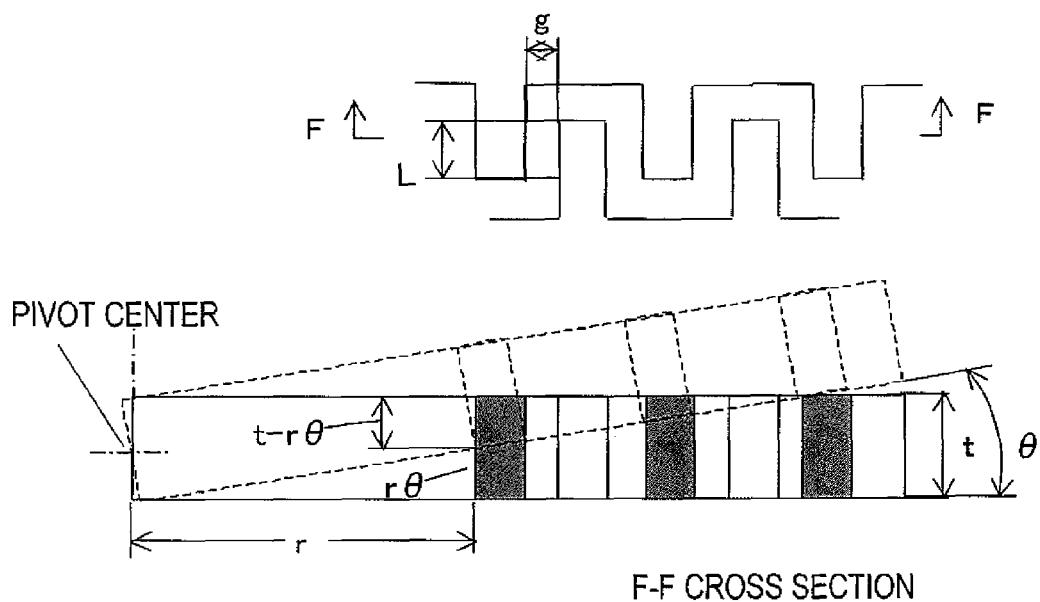
[FIG. 10] A cross-sectional view showing an opposing area between auxiliary electrode combteeth of a resonant mirror device according to an embodiment of the present invention.

FIG. 10 is a cross-sectional view showing an opposing area between auxiliary electrode combteeth of the resonant mirror device 1. The cross-sectional view shown in FIG. 10 corresponds to an F-F cross section in an upper plan view shown thereabove.

With reference to FIG. 10, an opposing area S' of an electrode which is at a distance r from the pivot center is expressed as:

$$S'=L(t-r\theta). \quad \text{[eq.4]}$$

When all auxiliary electrode combteeth are totaled, the auxiliary electrode combteeth have an opposing area Sside as follows.

$$S_{side}=\Sigma S' \quad \text{[eq.5]}$$

Figure 11:
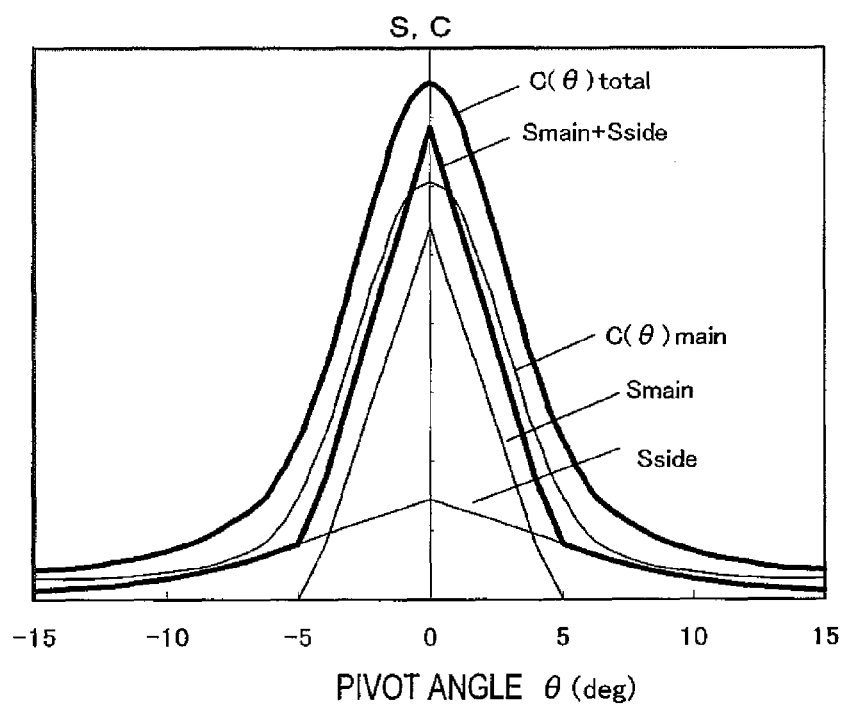
[FIG. 11] A graph showing opposing area between electrodes and change in capacitance of a resonant mirror device according to an embodiment of the present invention.

FIG. 11 is a graph showing opposing area between electrodes and change in capacitance of the resonant mirror device 1.

With reference to FIG. 11, Smain exhibits non-zero values in a range where the electrode combteeth overlap one another, but is zero outside the range. On the other hand, as for change in capacitance C(θ), in actuality, small capacitances would occur also in portions other than the opposing faces of the combteeth (e.g., at tips of combteeth and at edges lacking combteeth). Therefore, the distribution of C(θ) main presents a gentle curve in which Smain is contained.

In the example shown in FIG. 11, when the mirror section has a pivot angle of ±15° and the mirror section has a length r of 0.5 mm and a thickness of 50 μm, approximately ±5° is the range of overlap.

On the other hand, Sside has a small peak value because of there being fewer combteeth, but, because of being located near the pivot center, makes an overlap in a broader range of pivot angles than do the main electrode combteeth, thus resulting in a broad angular range of non-zero values. Therefore, their sum, Smain+Sside, has non-zero values across the entire pivoting range, and C(θ)total is increased over C(θ) main even with respect to values in the regions with large pivot angles. Thus, the auxiliary electrode combteeth have an effect of providing an increased capacitance in the region of large pivot angles, as compared to the case where there are only the main electrode combteeth. When the capacitance is increased because of the auxiliary electrode combteeth, the driving force is also increased accordingly.

Moreover, when detecting a pivot angle of the mirror section by detecting capacitance, change in capacitance can be surely detected even with respect to large pivot angles such that overlap between main electrode combteeth is lost. Thus, by allowing the pivot angle of the mirror section to be fed back to the driving signal, a surer resonance driving can be performed.

Embodiment 2

Figure 12:
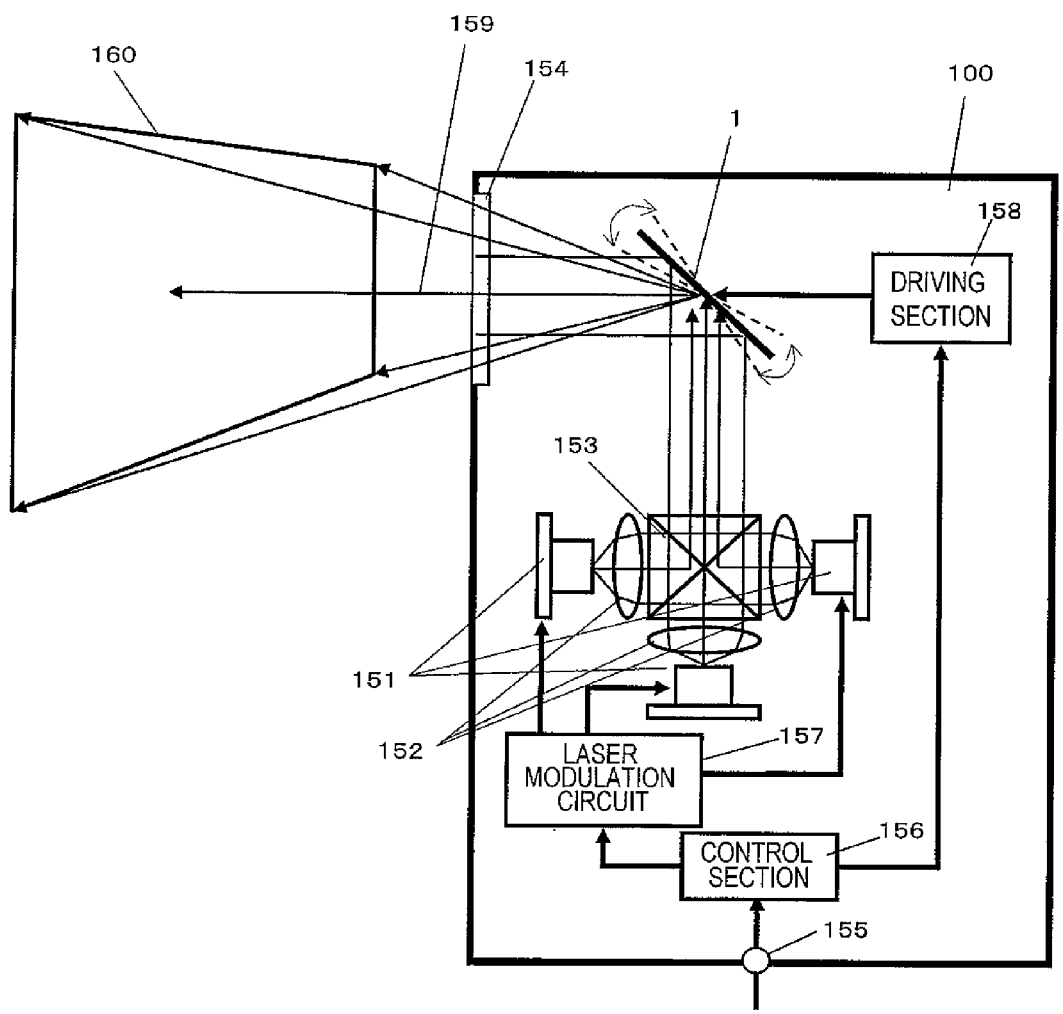
[FIG. 12] A diagram showing an image projection apparatus incorporating a resonant mirror device according to an embodiment of the present invention.
Figure 13:
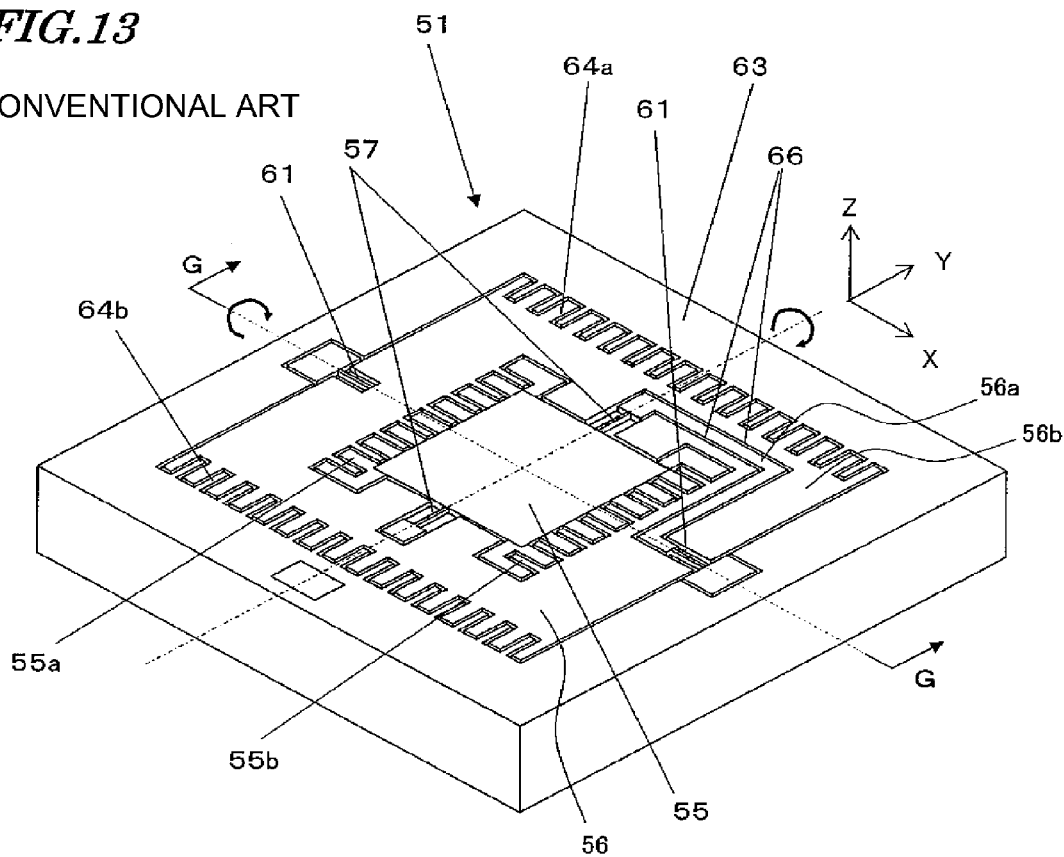
[FIG. 13] A perspective view showing a bi-axial pivoting type resonant mirror device.
Figure 14:
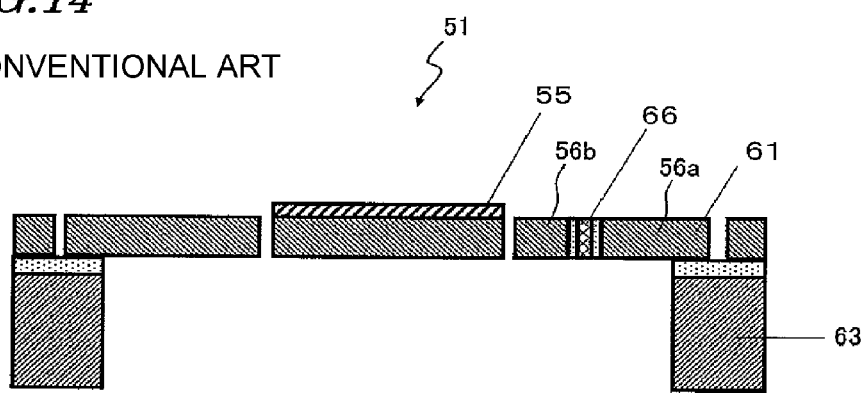
[FIG. 14] A cross-sectional view showing a bi-axial pivoting type resonant mirror device.
Figure 15:
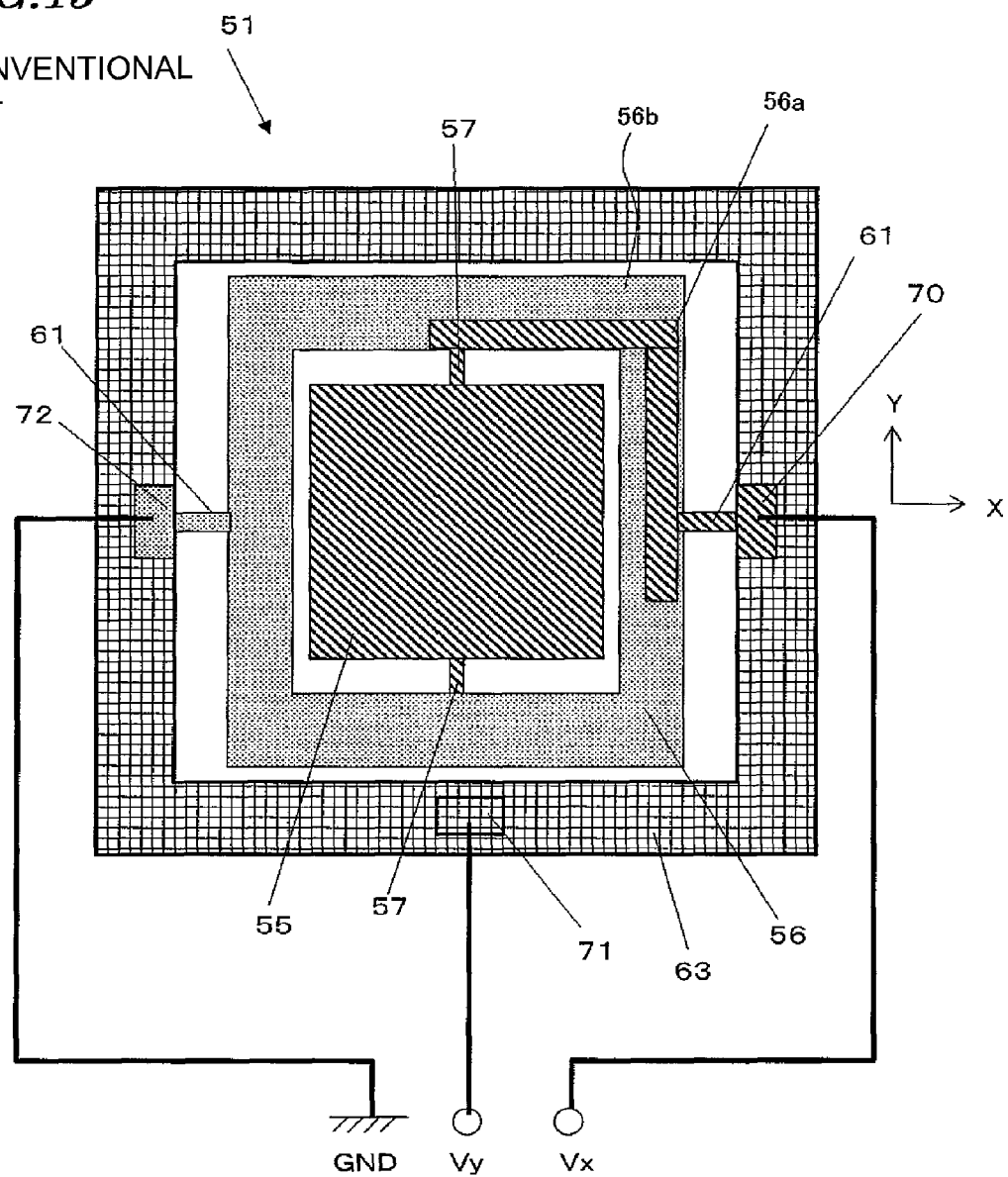
[FIG. 15] A plan view showing an electrical isolation scheme in a bi-axial pivoting type resonant mirror device.

Next, with reference to FIG. 12, an image projection apparatus 100 according to a second embodiment of the present invention will be described. FIG. 12 is a diagram showing an image projection apparatus 100 incorporating the aforementioned resonant mirror device 1.

The image projection apparatus 100 includes a resonant mirror device 1, light sources 151, collimating lenses 152, a dichroic prism 153, a control section 156, a laser modulation circuit 157, and a driving section 158. The collimating lenses 152 and the dichroic prism 153 are optics for guiding light beams which are emitted from the light sources 151 to the resonant mirror device 1.

In accordance with an image signal 155 which is input to the image projection apparatus 100, the control section 156 controls the operation of the laser modulation circuit 157 and the driving section 158. The driving section 158 drives the resonant mirror device 1. The laser modulation circuit 157 generates a modulation signal which is in accordance with the image signal 155, and the three light sources 151 emit light beams 159 of red (R), green (G), and blue (B) in accordance with the modulation signal. The light beams 159 are made into substantially parallel rays of light through the collimating lenses 152, and are merged by the dichroic prism 153 to enter the resonant mirror device 1. The light beams 159 which enter the resonant mirror device 1 and are reflected therefrom are subjected to a two-dimensional scanning by the resonant mirror device 1, and emitted through an aperture 154, thus displaying an image in a projection region 160.

INDUSTRIAL APPLICABILITY

The present invention is particularly useful in technological fields where a direction of light travel is changed by using a mirror device. For example, it is useful for optical scanning apparatuses for use in laser printers and the like, reading apparatuses such as bar-code readers, laser projectors, and so on.

The invention claimed is:
1. An actuator comprising:
   a movable section; and
   a stationary section supporting the movable section,
      wherein, the movable section includes:
   a first conductive portion to which a first voltage is applied;
   a second conductive portion to which a second voltage is applied; and
   backlining for stabilizing the first conductive portion and the second conductive portion to each other in an electrically insulated state,
   wherein:
   the second conductive portion and the backlining are electrically connected,
   the movable section includes a first movable section and a second movable section supporting the first movable section;
   the stationary section supports the second movable section;
   the second movable section includes the first and second conductive portions;
   the first voltage is supplied to the first movable section via the first conductive portion; and the second movable section further includes electrode combteeth formed in the second conductive portion and in the backlining.

2. The actuator of claim 1, wherein the backlining has a thickness which is thinner than a thickness of the stationary section.

3. The actuator of claim 1, wherein,
the first movable section includes a mirror section for reflecting light; and
the first conductive portion and the second conductive portion are stabilized by the backlining on a face of the actuator opposite from a face on which the mirror section is provided.

4. The actuator of claim 1, wherein,
the first and second movable sections are formed by, in an SOI wafer in which first and second silicon layers are bonded via an insulating layer, etching the first silicon layer; and
the backlining is formed by etching the second silicon layer.

5. The actuator of claim 1, wherein the first conductive portion and the second conductive portion are electrically insulated from each other by a trench which is formed between the first conductive portion and the second conductive portion of the second movable section.

6. The actuator of claim 5, wherein a dummy trench is formed in a point symmetric position from the trench in the second movable section.

7. The actuator of claim 1, wherein,
the first movable section includes first and second electrode combteeth for generating a driving force for causing a relative displacement of the first movable section with respect to the second movable section;
the first electrode combteeth extend in a direction which is perpendicular to a pivot axis of the first movable section;
the second electrode combteeth extend in a direction which is parallel to the pivot axis of the first movable section;
the second movable section includes third and fourth electrode combteeth for generating a driving force for causing a relative displacement of the second movable section with respect to the stationary section;
the third electrode combteeth extend in a direction which is perpendicular to a pivot axis of the second movable section; and
the fourth electrode combteeth extend in a direction which is parallel to the pivot axis of the second movable section.

8. An image projection apparatus comprising the actuator of claim 1, wherein,
the image projection apparatus comprises:
a light source for emitting a light beam;
optics for guiding the light beam to the actuator; and
a driving section for driving the actuator.

9. A production method for the actuator of claim 1, the production method comprising:
a step of forming the first and second movable sections by, in an SOI wafer in which first and second silicon layers are bonded via an insulating layer, etching the first silicon layer;
a step of forming the backlining by etching the second silicon layer; and
a step of electrically connecting a predetermined portion of the second conductive portion that is made of the first silicon layer to the backlining.

10. The production method of claim 9, wherein the step of forming the backlining includes
a step of etching the second silicon layer by using a mask which is used for etching the first silicon layer.

* * * * *